(12) United States Patent
Kurosawa

(10) Patent No.: US 9,644,128 B2
(45) Date of Patent: May 9, 2017

(54) CARBON NANOTUBE SHEET, ELECTRONIC DEVICE, METHOD OF MANUFACTURING CARBON NANOTUBE SHEET, AND METHOD OF MANUFACTURING ELECTRONIC DEVICE

(71) Applicant: SHINKO ELECTRIC INDUSTRIES CO., LTD., Nagano-shi (JP)

(72) Inventor: Takuya Kurosawa, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 11 days.

(21) Appl. No.: 14/689,484

(22) Filed: Apr. 17, 2015

(65) Prior Publication Data

US 2015/0315451 A1 Nov. 5, 2015

(30) Foreign Application Priority Data

Apr. 30, 2014 (JP) ................. 2014-093341

(51) Int. Cl.
*H05K 7/20* (2006.01)
*H01L 23/42* (2006.01)
(Continued)

(52) U.S. Cl.
CPC .............. *C09K 5/14* (2013.01); *H01L 23/373* (2013.01); *H01L 23/3737* (2013.01); *H01L 23/42* (2013.01); *H05K 7/2039* (2013.01); *B82Y 99/00* (2013.01); *H01L 23/3731* (2013.01); *H01L 2224/16225* (2013.01); *H01L 2224/32225* (2013.01); *H01L 2224/73204* (2013.01); *H01L 2924/15311* (2013.01); *H01L 2924/16152* (2013.01); *Y10S 977/742* (2013.01); *Y10S 977/75* (2013.01)

(58) Field of Classification Search
CPC ... H01L 23/42; H01L 23/373; H01L 23/3737; H01L 2924/15311; H01L 2224/73204; H01L 2224/32225; H01L 2924/16152; H01L 2224/16225; H01L 23/3731; H01L 2924/00; H05K 7/2039; Y10S 977/742; Y10S 977/743; Y10S 977/744; Y10S 977/745; Y10S 977/746; Y10S 977/747; Y10S 977/748; Y10S 977/749; Y10S 977/75; Y10S 977/751; Y10S 977/752
See application file for complete search history.

(56) References Cited

U.S. PATENT DOCUMENTS

2005/0255304 A1* 11/2005 Brink ................. B82Y 10/00
428/209
2006/0234056 A1* 10/2006 Huang ................. H01L 23/373
428/408

(Continued)

FOREIGN PATENT DOCUMENTS

JP 2011-204749 A1 10/2011
JP 2013-107781 A1 6/2013

*Primary Examiner* — Adam B Dravininkas
(74) *Attorney, Agent, or Firm* — Kratz, Quintos & Hanson, LLP

(57) ABSTRACT

A carbon nanotube sheet includes a plurality of carbon nanotubes including a first constriction portion in one end side, and a resin portion filled between the plurality of carbon nanotubes. Each of the plurality of carbon nanotubes is bent at the first constriction portion to a lateral direction in the resin portion.

7 Claims, 18 Drawing Sheets

(51) Int. Cl.
*H01L 23/373* (2006.01)
*C09K 5/14* (2006.01)
*B82Y 99/00* (2011.01)

(56) References Cited

U.S. PATENT DOCUMENTS

| | | | | |
|---|---|---|---|---|
| 2008/0241755 A1* | 10/2008 | Franklin | ................ | B82Y 10/00 |
| | | | | 430/296 |
| 2009/0237886 A1* | 9/2009 | Iwai | ..................... | H01L 23/373 |
| | | | | 361/708 |
| 2010/0027221 A1* | 2/2010 | Iwai | ..................... | H01L 23/373 |
| | | | | 361/711 |
| 2010/0124025 A1* | 5/2010 | Yamaguchi | ........... | H01L 23/373 |
| | | | | 361/708 |
| 2012/0236502 A1* | 9/2012 | Yamaguchi | ........... | H01L 23/373 |
| | | | | 361/704 |
| 2014/0315120 A1* | 10/2014 | Imanishi | ................ | H01M 4/96 |
| | | | | 429/523 |

\* cited by examiner (schematic view)

CARBON NANOTUBE SHEET, ELECTRONIC DEVICE, METHOD OF MANUFACTURING CARBON NANOTUBE SHEET, AND METHOD OF MANUFACTURING ELECTRONIC DEVICE

CROSS-REFERENCE TO RELATED APPLICATIONS

This application is based upon and claims the benefit of priority of the prior Japanese Patent Application No. 2014-093341, filed on Apr. 30, 2014, the entire contents of which are incorporated herein by reference.

FIELD

This invention is related to a carbon nanotube sheet, an electronic device, a method of manufacturing a carbon nanotube sheet, and a method of manufacturing an electronic device.

BACKGROUND ART

In the prior art, in the servers and the personal computers, in order to radiate the heat generated from the semiconductor element efficiently, the semiconductor element is connected to the heat spreader through the thermally conductive sheet. As the thermally conductive sheet, an indium sheet or the like is used, and the heat radiation member is formed of copper or the like which has high thermal conductivity.

However, the price of indium which is used as a material of the thermally conductive sheet is rising due to the increase of the demand, therefore there is fear to cause cost rising. Moreover, from a viewpoint of radiating efficiently the heat generated from the semiconductor element, the thermal conductivity of indium may not be high enough.

From such background, a technique in which carbon nanotubes are used as the material for the thermally conductive sheet has been proposed, the carbon nanotubes which have higher thermal conductivity than that of indium and can be formed with a lower cost.

A related art is disclosed in Japanese Laid-open Patent Publication No. 2011-204749, and Japanese Laid-open Patent Publication No. 2013-107781.

SUMMARY

In the carbon nanotube sheet, the density of the carbon nanotubes is low and the contact area with a heat generation body and a heat radiation member is small. Therefore, there is a problem that the original properties of the carbon nanotubes having high thermal conductivity cannot be utilized.

According to one aspect discussed herein, there is provided a carbon nanotube sheet, including a plurality of carbon nanotubes including a first constriction portion in one end side, and a resin portion filled between the plurality of carbon nanotubes.

Also, according to another aspect discussed herein, there is provided an electronic device, including a carbon nanotube sheet including a plurality of carbon nanotubes including a first constriction portion in one end side, and a resin portion filled between the plurality of carbon nanotubes, each of the plurality of carbon nanotubes is bent at the first constriction portion to a lateral direction in one surface side of the resin portion, a heat generation body arranged on one face of the carbon nanotube sheet, the heat generation body contacting a part which is bent at the first constriction portions located in the one end side of the plurality of carbon nanotubes, and a heat radiation member arranged on the other face of the carbon nanotube sheet, the heat radiation member contacting the other end side of the plurality of carbon nanotubes.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Hereinbelow, embodiments will be explained with reference to the accompanying drawings.

Figure 1A:
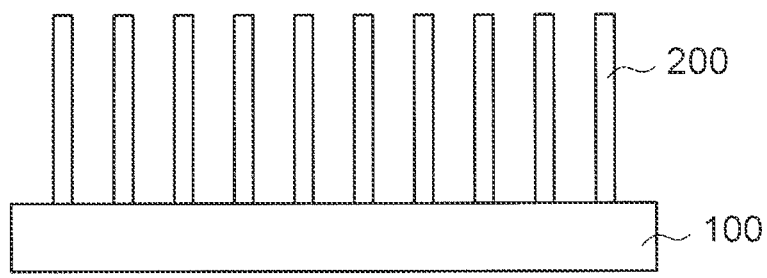
FIGS. 1A and 1B are cross-sectional views for explaining the problem of a carbon nanotube sheet according to a preliminary matter.
Figure 1B:
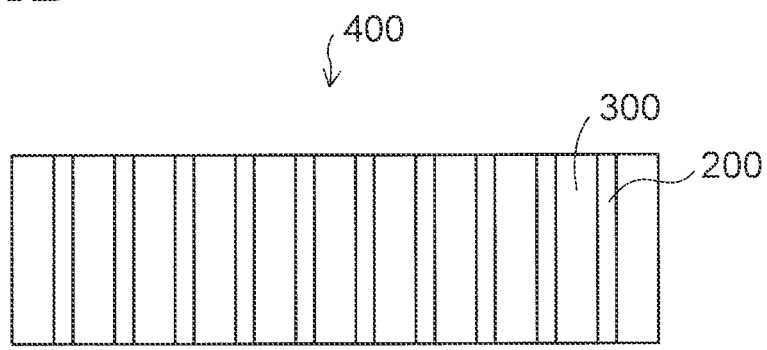

Prior to the explanation of embodiments, the preliminary matter to be set forth as a basis will be explained hereunder. FIGS. 1A and 1B are views for explaining the problem of a carbon nanotube sheet according to the preliminary matter.

As depicted in FIG. 1A, carbon nanotubes 200 are grown on a substrate 100 by CVD method. The carbon nanotubes 200 are formed with substantially the same diameter from a base end to a tip end.

The diameter of the carbon nanotubes 200 is small with about 15 nm. Therefore, the density of the total area that the carbon nanotubes 200 occupy in an upper face of the substrate 100 is only about 5%.

Thereafter, as depicted in FIG. 1B, a resin portion 300 is filled in the aggregate of the carbon nanotubes 200 and then the substrate 100 is detached, thus a carbon nanotube sheet 400 is obtained.

If such carbon nanotube sheet 400 is used as a thermally conductive sheet of a semiconductor device in the same state, the contact area with a semiconductor element and a heat radiation member is small. Therefore, there is a problem that the original high thermal conductivity of the carbon nanotubes 200 cannot be derived.

As this countermeasure, a technique is considered that the carbon nanotube sheet 400 is arranged on the semiconductor element, and the carbon nanotube sheet 400 is pressed by the heat radiation member downward, thus both end sides of each carbon nanotube 200 are bent, and the contact area is increased.

However, in order to bend each carbon nanotube 200, it is necessary to press the carbon nanotube sheet 400 with a relatively high pressure. Therefore, excess pressure is applied to the semiconductor element, thus sometimes the semiconductor element is destroyed.

The embodiments to be explained below can solve the problems mentioned above.

(First Embodiment)

FIG. 2A to FIG. 5 are views depicting a method of manufacturing a carbon nanotube sheet of a first embodiment. FIG. 6 is a view depicting a carbon nanotube sheet of the first embodiment.

Figure 2A:
FIGS. 2A to 2C are cross-sectional views depicting a method of manufacturing a carbon nanotube sheet of a first embodiment (part 1).

In the method of manufacturing a carbon nanotube sheet of the first embodiment, as depicted in FIG. 2A, first, a silicon substrate 10 is prepared. The silicon substrate 10 is used as a base for forming carbon nanotubes. An insulating layer which is a silicon oxide layer or the like may be formed on both faces of the silicon substrate 10.

A plurality of carbon nanotube formation regions are defined on the silicon substrate 10. FIG. 2A depicts one of the carbon nanotube formation regions.

The silicon substrate 10 is illustrated as a substrate, but various substrates which are ceramic substrate or glass substrate or the like can be used.

Figure 2B:

Then, as depicted in FIG. 2B, an iron (Fe) film having a film thickness of about 2.5 nm is formed on a whole face of the silicon substrate 10 by sputtering or the like, thus a catalytic metal film 12 is obtained. The catalytic metal film 12 is formed as a catalyst for forming carbon nanotubes by CVD method.

Besides iron, cobalt (Co), nickel (Ni), gold (Au), silver (Ag), or platinum (Pt) may be used as the catalytic metal film 12.

Figure 2C:
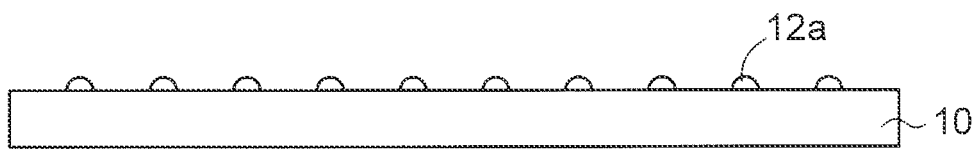

Then, as depicted in FIG. 2C, a heat process is performed to the silicon substrate 10 at a temperature of 650° C. for 5 to 10 minutes. By this matter, the catalytic metal film 12 is transformed into micro-particles and catalytic metal micro-particles 12a are obtained.

Next, a method of growing the carbon nanotubes by thermal CVD (Chemical Vapor Deposition) method will be explained. In this embodiment, a first growth condition and a second growth condition are used as a growth condition of the carbon nanotubes.

The first growth condition is a condition for growing carbon nanotubes having a diameter of about 15 nm.

In the first condition, for example, a mixed gas of acetylene and argon in which a partial pressure ratio is 1:9 as a raw material gas, is flowed in a chamber at a flow rate of 20 sccm, thus the total gas pressure in the chamber is set to 1 kPa and the temperature is set to 650° C.

On the other hand, the second growth condition is a condition for growing carbon nanotubes having a diameter of about 10 nm and is a condition in which the diameter of the carbon nanotubes is smaller than a case that the first growth condition is used.

In the second growth condition, the flow rate of the mixed gas of acetylene and argon is reduced by half in the first growth condition, and the mixed gas is flowed in the chamber at a flow rate of 10 sccm. The other conditions are the same as those of the first growth condition.

Alternatively, the second growth condition may be the condition in which the temperature is raised from 650° C. to 700° C. in the first growth condition, or the temperature is lowered from 650° C. to 600° C. The other conditions are the same as those of the first growth condition.

By using the first growth condition and the second growth condition, the diameter of the carbon nanotubes can be changed in the growth process of the carbon nanotubes.

Figure 3A:
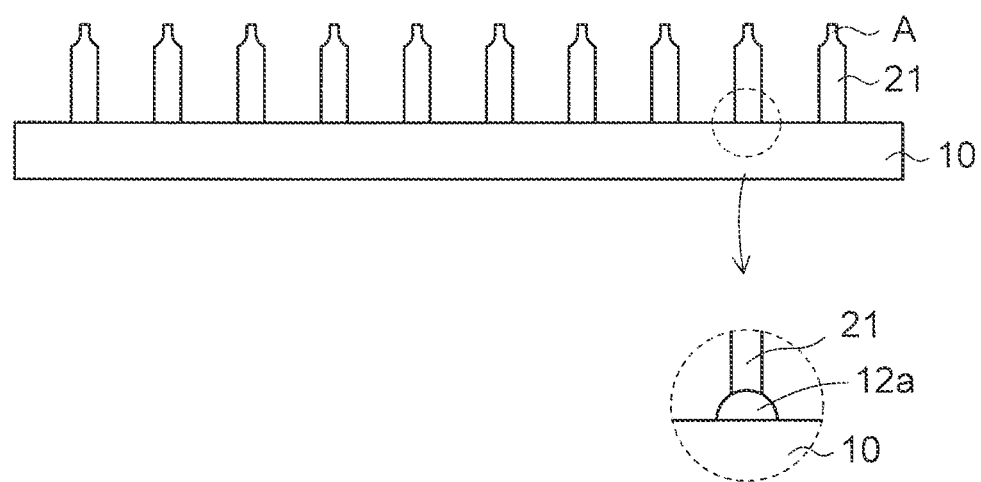
FIGS. 3A and 3B are cross-sectional views depicting the method of manufacturing a carbon nanotube sheet of the first embodiment (part 2).

As explained concretely, as depicted in FIG. 3A, carbon nanotube portions 21 are grown on the silicon substrate 10 while using the catalytic metal micro-particles 12a as the catalyst under the first growth condition until the height of the first carbon nanotube portions 21 reach about 20 µm. At this time, the first carbon nanotube portions 21 grow with a diameter of about 15 nm.

As depicted in the partially enlarged view in FIG. 3A, each of the first carbon nanotube portions 21 grown on the catalytic metal micro-particles 12a is formed to be oriented in a vertical direction to the surface of the silicon substrate 10.

Subsequently, similarly as depicted in FIG. 3A, the growth condition is changed to the second growth condition, and the carbon nanotubes are continuously grown on the first carbon nanotube portions 21. At this time, the carbon nanotubes are grown with their diameter reduced to about 10 nm, and are formed as first constriction portions A linked to the first carbon nanotube portions 21. The height of the first constriction portions A is 2 µm to 5 µm and is set to 3.5 µm, for example.

Figure 3B:
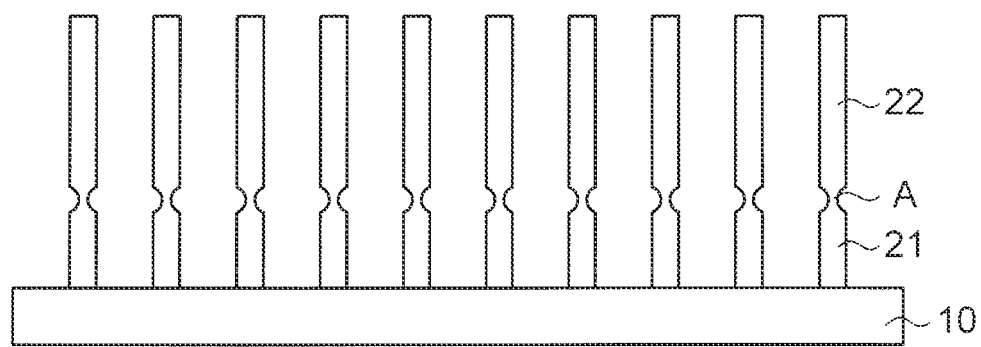

Further, as depicted in FIG. 3B, the growth condition is changed back to the first growth condition, and second carbon nanotube portions 22 linked to the first constriction portions A are grown. The height of the second carbon nanotube portions 22 from the first constriction portions A is set to about 150 µm.

Figure 4A:
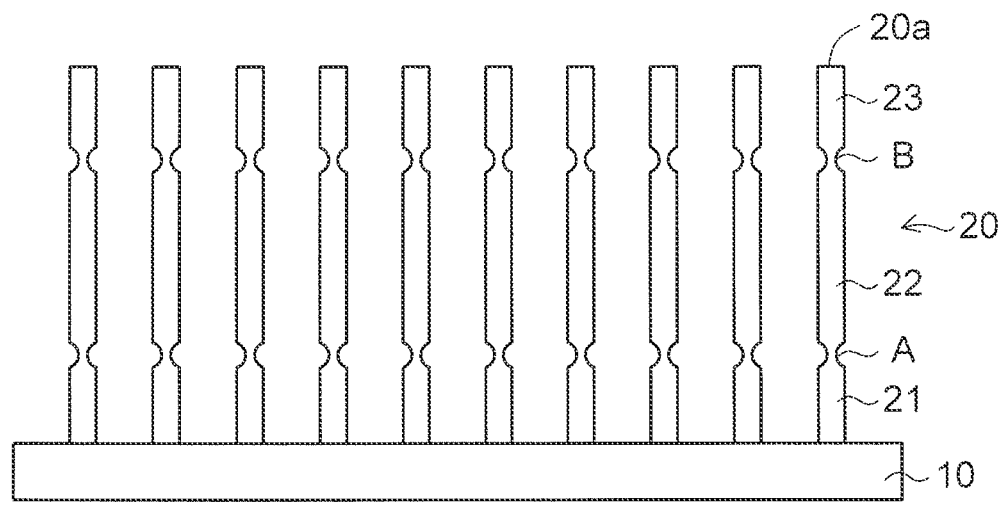
FIGS. 4A and 4B are cross-sectional views depicting the method of manufacturing a carbon nanotube sheet of the first embodiment (part 3).

Subsequently, as depicted in FIG. 4A, the growth condition is changed again to the second growth condition, and the carbon nanotubes linked to the second carbon nanotube portions 22 is continuously grown. At this time, similarly, the carbon nanotubes are grown with their diameter reduced to about 10 nm, and are formed as second constriction portions B linked to the second carbon nanotube portions 22.

Further, similarly, as depicted in FIG. 4A, the growth condition is changed back again to the first growth condition, and third carbon nanotube portions 23 linked to the second constriction portions B are grown. Similarly to the first carbon nanotube portions 21, the height of the third carbon nanotube portions 23 is set to about 20 µm and the diameter thereof is set to 15 nm.

In this way, carbon nanotubes 20a are formed in which the first carbon nanotube portions 21 and the second carbon nanotube portions 22 are linked by the first constriction portions A and the second carbon nanotube portions 22 and the third carbon nanotube portions 23 are linked by the second constriction portions B.

By this way, a carbon nanotube aggregate 20 is obtained in which the plurality of carbon nanotubes 20a are arrayed side by side to a lateral direction on the silicon substrate 10. Each carbon nanotube 20a includes the first constriction portion A in a base end side and the second constriction portion B in a tip end side.

As mentioned later, the carbon nanotube aggregate 20 is used as a thermally conductive sheet and arranged between a heat generation body and a heat radiation member. At this time, each carbon nanotube 20a is bent to a lateral direction from the first constriction portion A and the second constriction portion B, thereby the first and third carbon nanotube portions 21, 23 extend to the lateral direction, and contact the heat generation body and the heat radiation member.

By this matter, each of the contact area between the carbon nanotube aggregate 20, and the heat generation body and the heat radiation member can be enlarged.

Figure 4B:
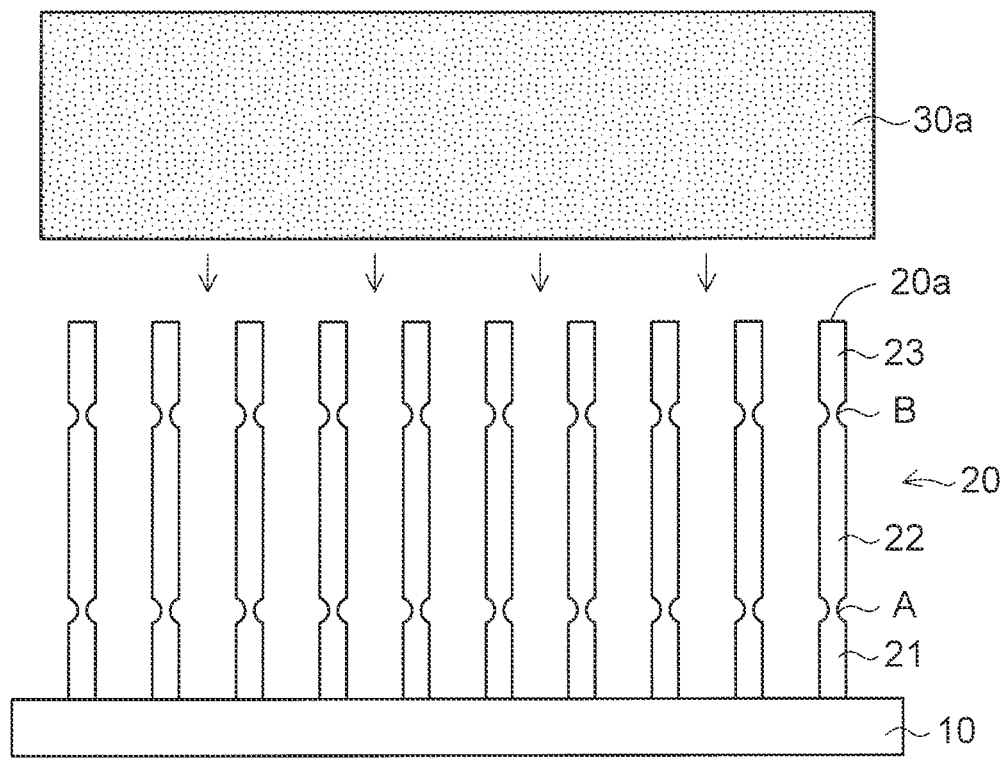

Then, as depicted in FIG. 4B, a thermoplastic resin sheet 30a is arranged on the carbon nanotube aggregate 20, and while pressing the thermoplastic resin sheet 30a downward by a pressing member (not depicted), a heat process is performed at a temperature of about 200° C.

By this matter, the thermoplastic resin sheet 30a is softened, and the resin is poured in the space in the carbon nanotube aggregate 20 to impregnate the space with the resin.

Figure 5:
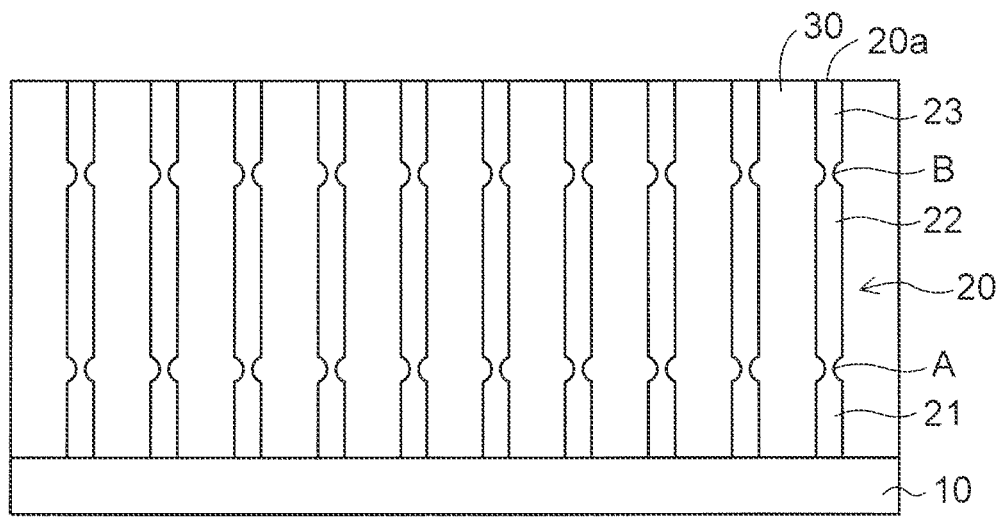
FIG. 5 is a cross-sectional view depicting the method of manufacturing a carbon nanotube sheet of the first embodiment (part 4).
Figure 6:
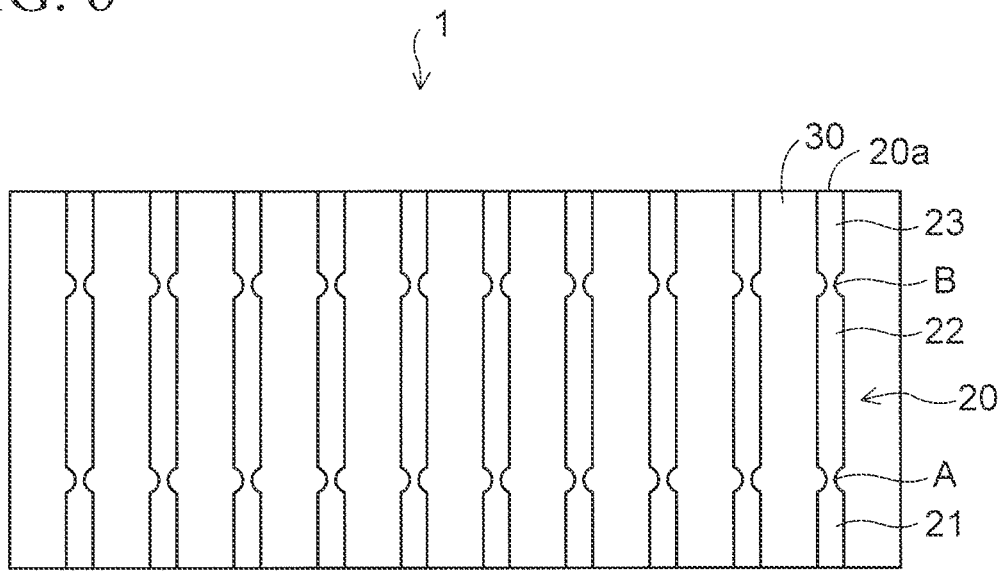
FIG. 6 is a cross-sectional view depicting a carbon nanotube sheet of the first embodiment.

In this way, as depicted in FIG. 5, a resin portion 30 is filled in the space in the carbon nanotube aggregate 20. By this matter, the carbon nanotube aggregate 20 is integrated like a sheet by the resin portion 30.

Alternatively, the resin portion 30 may be formed by coating a liquid thermoplastic resin by means of a dispenser or the like.

Subsequently, the carbon nanotube aggregate 20 which is integrated like the sheet by the resin portion 30 is detached from the silicon substrate 10. Then, the carbon nanotube aggregate 20 like the sheet is cut such that individual carbon nanotube formation regions can be obtained.

By the above steps, as depicted in FIG. 6, a carbon nanotube sheet 1 of the embodiment is manufactured. In the carbon nanotube sheet 1, since the carbon nanotube aggregate 20 is integrated by the resin portion 30 and is made to a single sheet shape. Therefore, the carbon nanotube sheet 1 has good handleability.

Figure 7:
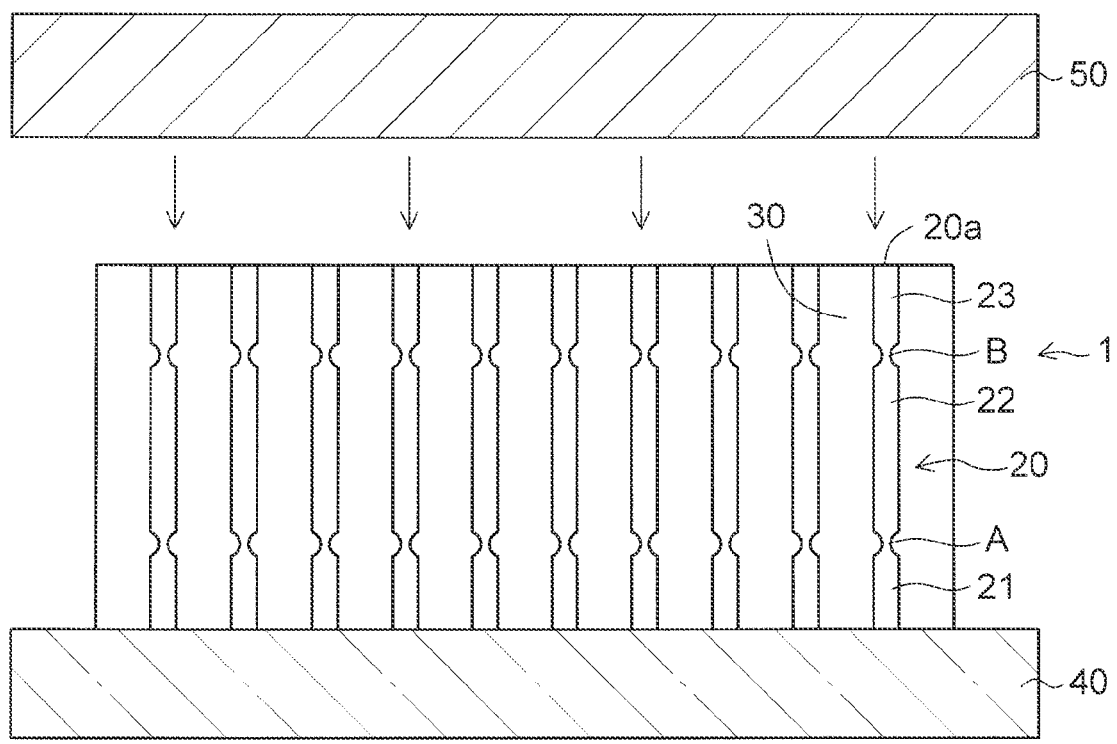
FIG. 7 is a cross-sectional view depicting a method of manufacturing an electronic device including the carbon nanotube sheet of the first embodiment.

Next, a method of using the carbon nanotube sheet 1 as a thermally conductive sheet will be explained. As depicted in FIG. 7, the carbon nanotube sheet 1 in FIG. 6 mentioned above is arranged on a heat generation body 40 which is a semiconductor element or the like. Further, a heat radiation member 50 is arranged on the carbon nanotube sheet 1. Then, while pressing the heat radiation member 50 downward, a heat process is performed at a temperature of about 250° C.

Figure 8:
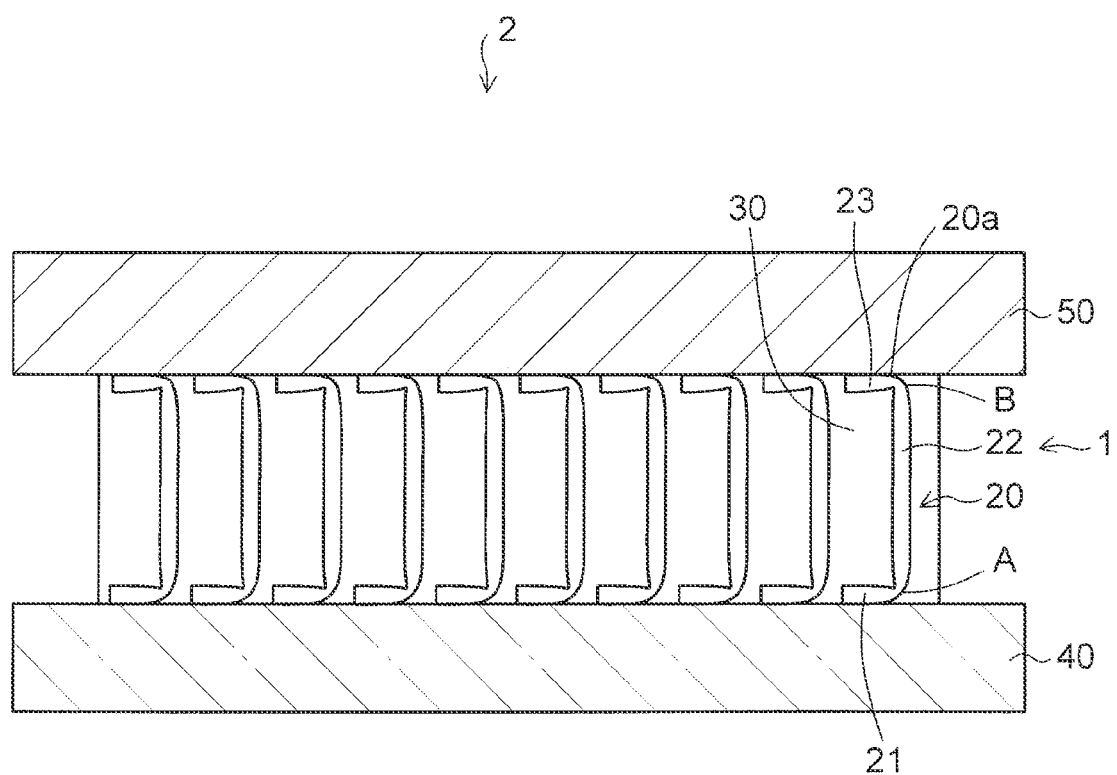
FIG. 8 is a cross-sectional view depicting an electronic device including the carbon nanotube sheet of the first embodiment (part 1).

By this matter, as depicted in FIG. 8, while the thermoplastic resin portion 30 of the carbon nanotube sheet 1 is melted, each carbon nanotube 20a is bent at the first constriction portion A and the second constriction portion B to the lateral direction. As a result, the first carbon nanotube portion 21 in a lower end side and the third carbon nanotube portion 23 in an upper end side are arranged to the lateral direction.

By this matter, the first carbon nanotube portion 21 which is bent at the first constriction portion A located in the lower end side of each carbon nanotube 20a contacts the heat generation body 40. The length of the first carbon nanotube portion 21 is about 20 µm, and the whole of the first carbon nanotube portion 21 contacts the heat generation body 40.

Similarly, the third carbon nanotube portion 23 which is bent at the second constriction portion B located in the upper end side of each carbon nanotube 20a contacts the heat radiation member 50. The length of the third carbon nanotube portion 23 is about 20 µm as well, and the whole of the third carbon nanotube portion 23 contacts the heat radiation member 50.

By the above steps, as depicted in FIG. 8, an electronic device 2 including the carbon nanotube sheet 1 in FIG. 6 is manufactured.

As mentioned in the explanation of the preliminary matter, unlike this embodiment, in the case that the carbon nanotubes are not bent, the density of the total area that the carbon nanotube aggregate occupies in the surface of each of the heat generation body and the heat radiation member is about 5%.

On the other hand, in the electronic device 2 of this embodiment, the both end sides of each carbon nanotube 20a are bent, thus the both end sides thereof are made to contact the heat generation body 40 and the heat radiation member 50. For this reason, the density of the total area that the carbon nanotube aggregate 20 occupies on the surface of each of the heat generation body 40 and the heat radiation member 50 can be increased to about 40 to 60%.

By this matter, the thermal resistance of the thermal conduction paths between the carbon nanotube sheet 1, and the heat generation body 40 and heat radiation member 50 is reduced. Therefore, the heat generated from the heat generation body 40 can be sufficiently transferred to the heat radiation member 50 side through the carbon nanotube sheet 1 and can be radiated.

In this way, since the contact area between the carbon nanotube aggregate 20, and the heat generation body 40 and heat radiation member 50 can be increased, the original properties of the carbon nanotube sheet 1 can be derived, thus the thermal conductivity can be improved.

Moreover, unlike this embodiment, in the case that the carbon nanotubes are bent without forming the constriction portions in the carbon nanotubes, it is necessary to press the carbon nanotube sheet with a high pressure of about 1 MPa. In the case that the heat generation body is a semiconductor element, if the excess pressure is applied to the semiconductor element, sometimes the semiconductor element is destroyed.

However, in this embodiment, the first constriction portions A and the second constriction portions B are formed in both end sides of the carbon nanotubes 20a, and the carbon nanotubes 20a are bent to use these portions as the base points.

For this reason, by pressing the carbon nanotube sheet 1 with a low pressure of 0.5 MPa, each carbon nanotube 20a can be easily bent. Accordingly, even when the heat generation body 40 is the semiconductor element, there is no fear that the semiconductor element is destroyed.

In FIG. 8, all the carbon nanotubes 20a are bent to the same direction.

Figure 9:
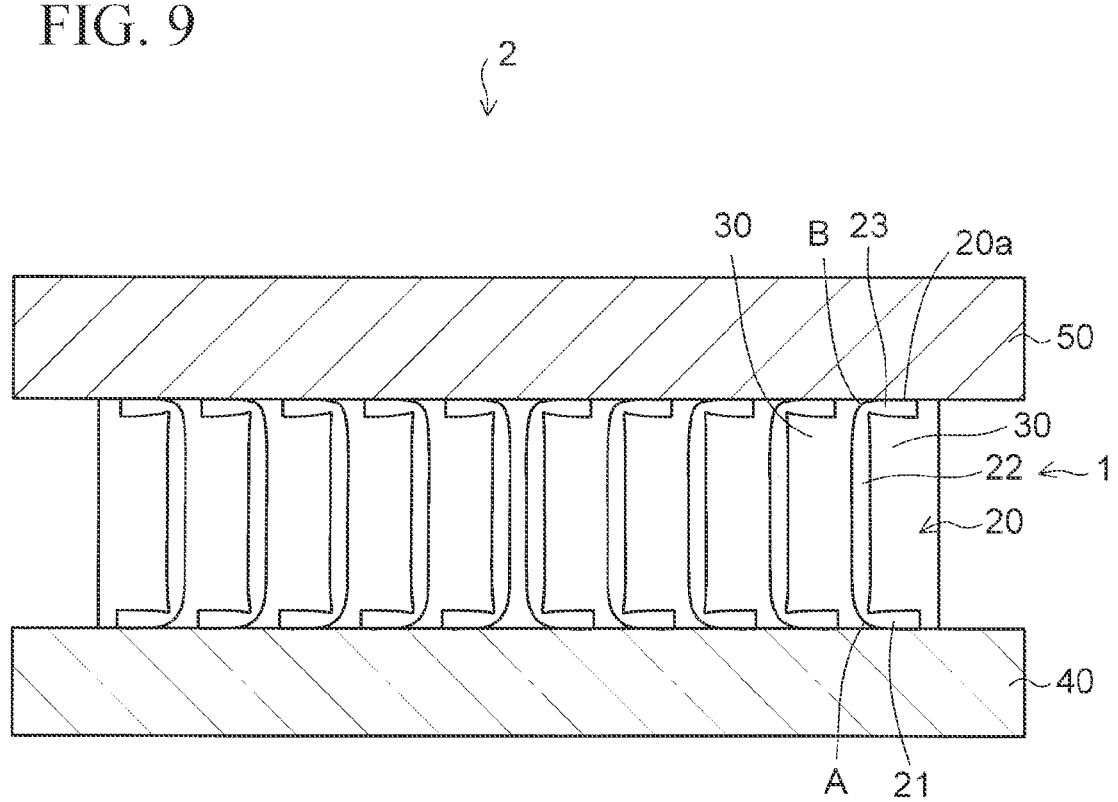
FIG. 9 is a cross-sectional view depicting the electronic device including the carbon nanotube sheet of the first embodiment (part 2).

Alternatively, as depicted in FIG. 9, in the many carbon nanotubes 20a, the bending direction may be the reverse direction each other.

Furthermore, also there is a case that the many carbon nanotubes 20a are bent in random directions.

In this way, depending on the growth condition of the carbon nanotubes 20a, the diameter and length of the first and second constriction portions A, B, the pressing condition, or the like, the directions that the carbon nanotubes 20a are bent are made to the various modes.

As a preferred mode in this embodiment, the first and second constriction portions A, B are formed respectively in both end sides of each carbon nanotube 20a, and the carbon nanotube 20a are bent in both end sides. Besides this mode, the constriction portion may be formed in at least one of the one end side (lower end side) and the other end side (upper end side) of each carbon nanotube 20a.

Figure 10:
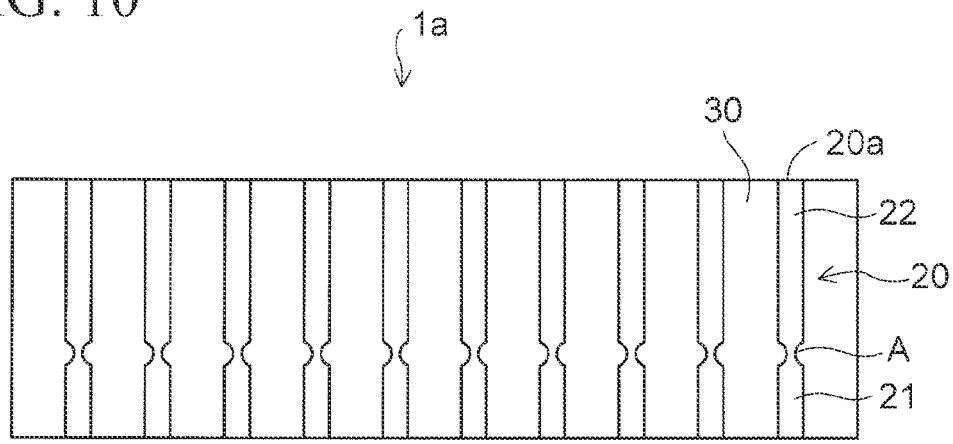
FIG. 10 is a cross-sectional view depicting a carbon nanotube sheet of a modification of the first embodiment.

In a carbon nanotube sheet 1a of a modification in FIG. 10, the constriction portion A is formed in only the one end side of each carbon nanotube 20a, and no constriction portion is formed in the other end side. Also similarly, the resin portion 30 is filled in the space in the carbon nanotube aggregate 20.

Figure 11:
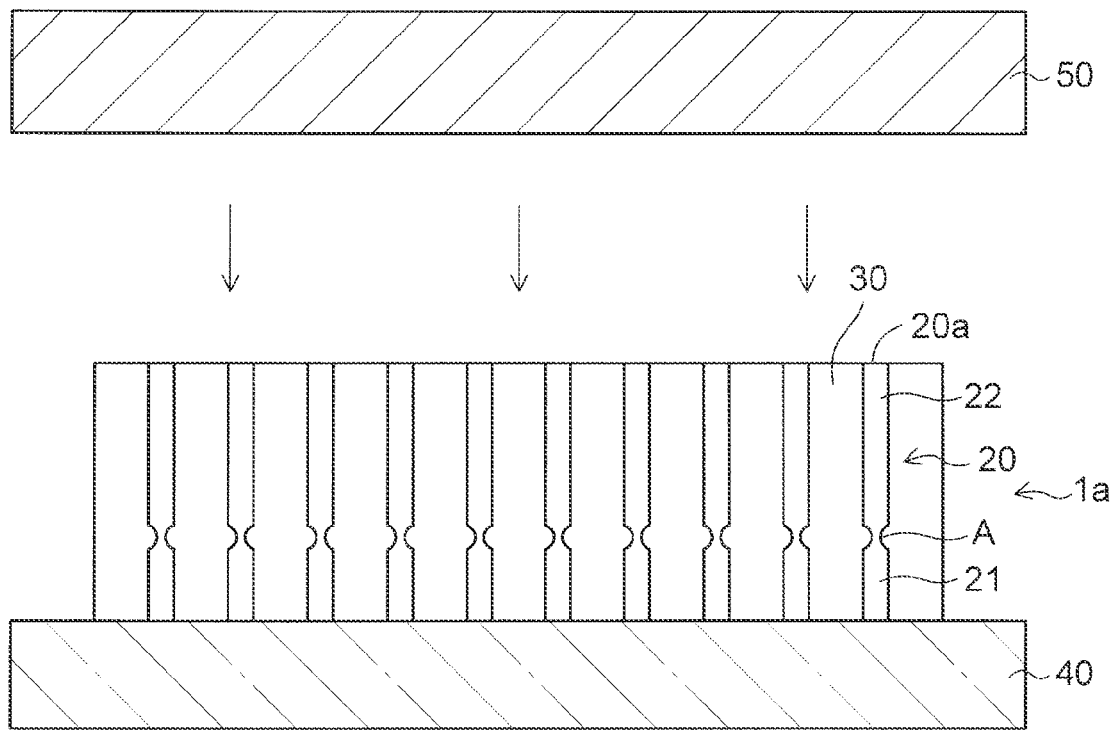
FIG. 11 is a cross-sectional view depicting a method of manufacturing an electronic device including the carbon nanotube sheet of the modification of the first embodiment.

Then, as depicted in FIG. 11, the carbon nanotube sheet 1a of the modification in FIG. 10 is arranged on the heat generation body 40. Further, the heat radiation member 50 is arranged on the carbon nanotube sheet 1a. Then, while pressing the heat radiation member 50 downward, a heat process is performed.

Figure 12:
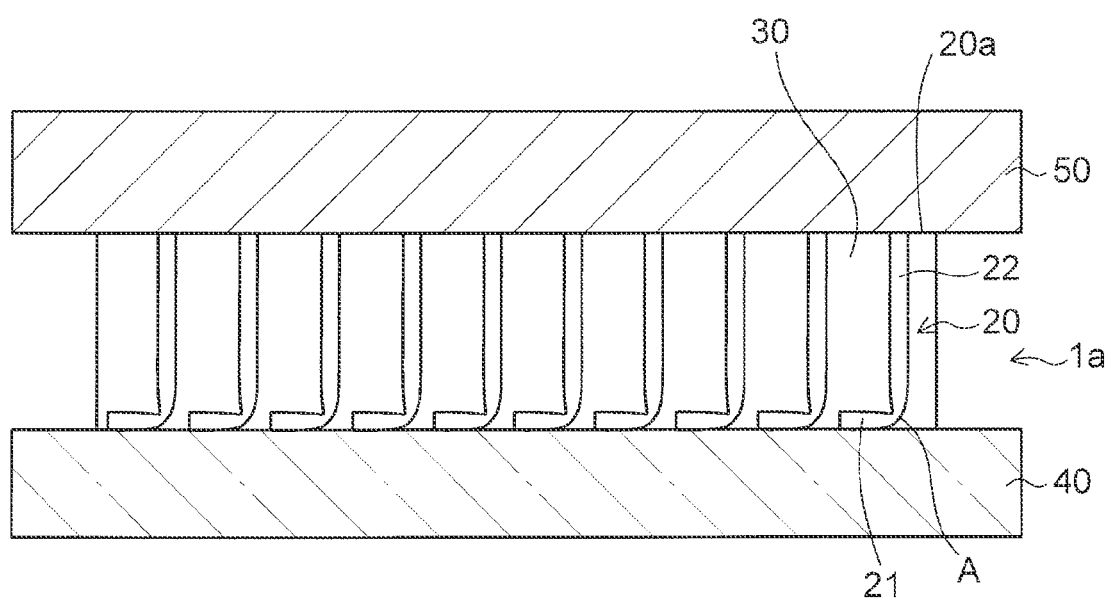
FIG. 12 is a cross-sectional view depicting an electronic device including the carbon nanotube sheet of the modification of the first embodiment.

By this matter, as depicted in FIG. 12, the first carbon nanotube portion 21 of each carbon nanotube 20a is bent at the constriction portion A in the one end side to the lateral direction. As a result, the first carbon nanotube portion 21 arranged to be bent to the lateral direction contacts the heat generation body 40.

On the other hand, since no constriction portion is formed in the upper end side of each carbon nanotube 20a, the second carbon nanotube portion 22 is not bent and a tip end face of each carbon nanotube 20a contacts the heat radiation member 50.

Alternatively, as reversed to FIG. 10, the mode is employed in which a constriction portion may be formed only in the other end side (upper end side) of each carbon nanotube 20a, and no constriction portion may be formed in the one end side (lower end side). In this mode, in the upper end side of the carbon nanotube, the carbon nanotube portion arranged to be bent to the lateral direction contacts the heat radiation member. Also, in the one end side of the carbon nanotube, the tip end face of the carbon nanotube contacts the heat generation body.

In this way, a constriction portion may be formed in at least one of the one end side (lower end side) and the other end side (upper end side) of each carbon nanotube 20a and the carbon nanotube 20a may be bent therefrom. It is possible to increase the contact area with one of the heat generation body and the heat radiation member. Therefore, the thermal conductivity can be improved as compared to the case that it is not bent.

The carbon nanotube sheets 1, 1a of this embodiment can be used as the thermally conductive sheet which radiates the heat generated from various kinds of heat generation bodies to the heat radiation member.

As the heat generation body 40, besides a semiconductor element, LED (light Emitting Diode), the motor of an automobile or the like, an inverter unit for converting direct current to alternating current which is used for a solar panel system, or the like, are available.

Next, an example of applying the carbon nanotube sheet 1 of this embodiment in FIG. 6 to a semiconductor device will be explained. The semiconductor device is one example of the electronic device.

Figure 13A:
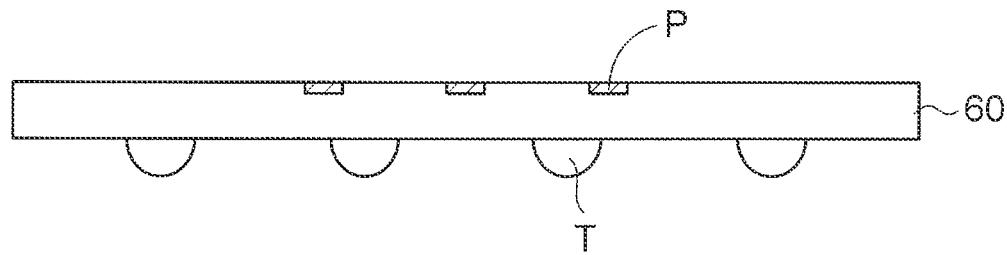
FIGS. 13A to 13C are cross-sectional views depicting a method of applying the carbon nanotube sheet of the first embodiment to a semiconductor device (part 1).

As depicted in FIG. 13A, first, a wiring substrate 60 is prepared. The wiring substrate 60 includes connection pads P made of copper or the like on an upper face side thereof, and includes external connection terminals T made of solder or the like on a lower face side thereof. The connection pads P are electrically connected to the external connection terminals T through multi-layer wirings (not depicted) formed inside the wiring substrate 60.

Figure 13B:
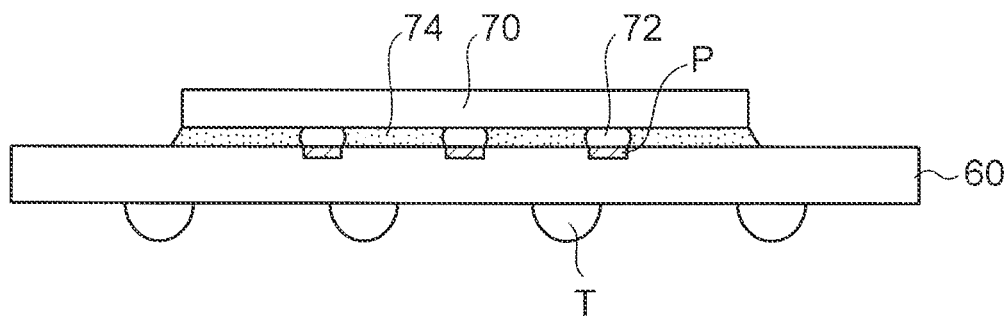

Further, as depicted in FIG. 13B, a semiconductor element 70 (LSI chip) including bump electrodes 72 on a lower face side thereof is prepared. Then, the bump electrodes 72 of the semiconductor element 70 are flip-chip connected to the connection pads P of the wiring substrate 60 through solder (not depicted). As the semiconductor element 70, a CPU chip or the like in which amount of the heat generation is large during its operation is used.

Thereafter, an underfill resin 74 is filled between the semiconductor element 70 and the wiring substrate 60.

Figure 13C:
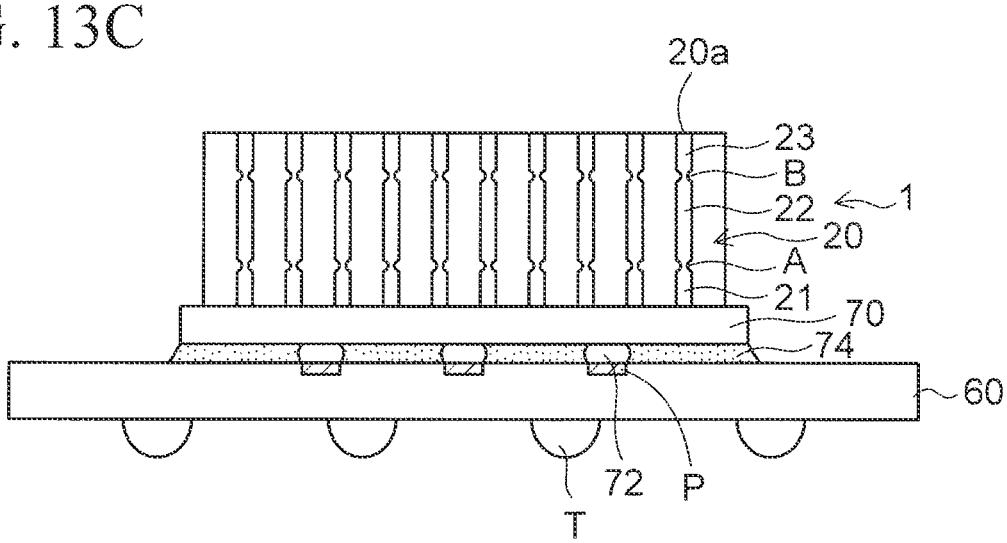

Then, as depicted in FIG. 13C, the carbon nanotube sheet 1 in a state before it is bent in FIG. 6 mentioned above is arranged on a back face of the semiconductor element 70.

Figure 14:
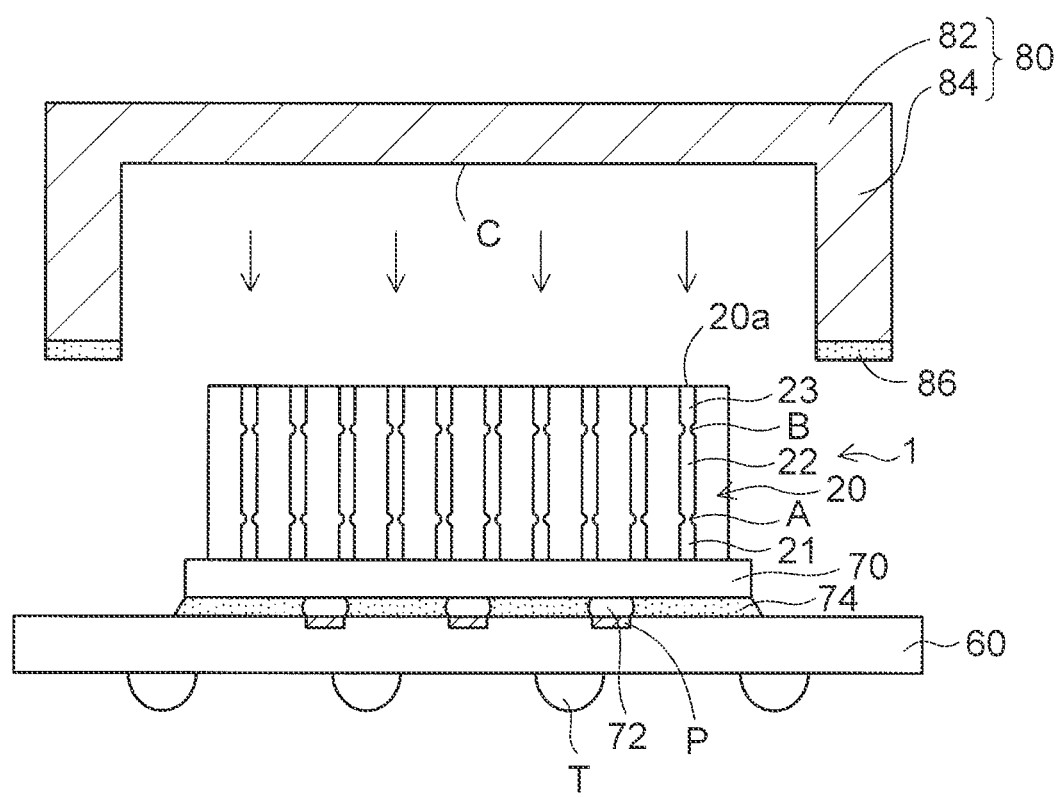
FIG. 14 is a cross-sectional view depicting the method of applying the carbon nanotube sheet of the first embodiment to a semiconductor device (part 2).

Further, as depicted in FIG. 14, a heat spreader 80 is prepared as the heat radiation member. The heat spreader 80 includes a flat plate portion 82 and an annular protruding portion 84 protruding downward from a periphery of the flat plate portion 82, and a concave portion C is provided in a center part on a lower face side of the heat spreader 80. As one example of the heat spreader 80, the structure body is used in which nickel plating is applied on the outer face of an oxygen-free copper member.

Then, the protruding portion 84 of the heat spreader 80 is arranged on a periphery part of the wiring substrate 60 through a thermosetting adhesive 86.

Further, while pressing the heat spreader 80 downward by a pressing member (not depicted), a heat process is performed at a temperature of about 250° C.

Figure 15:
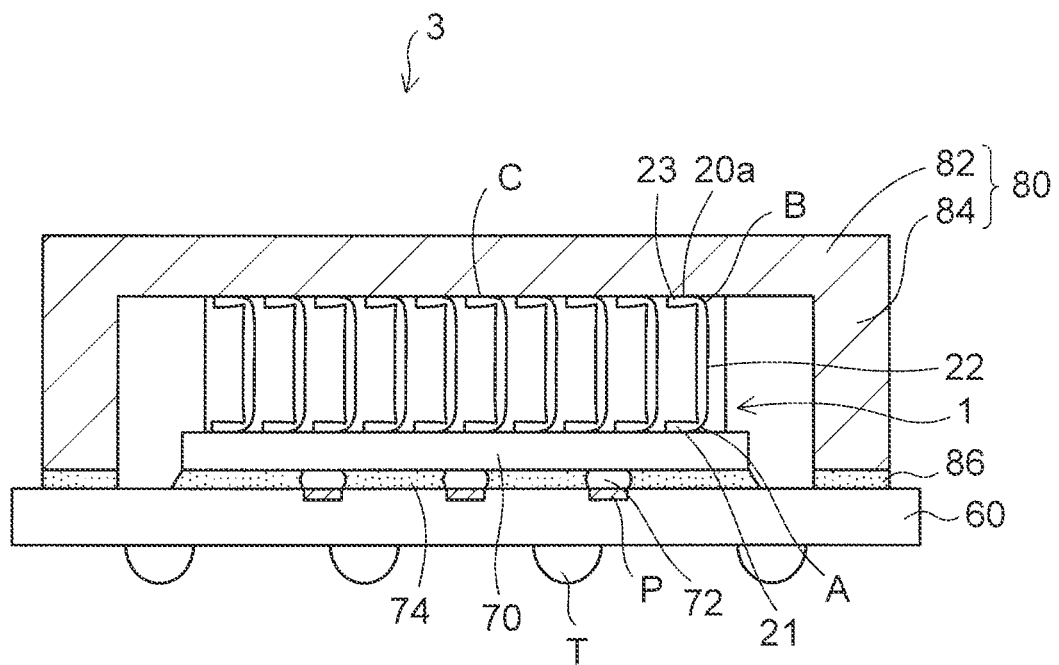
FIG. 15 is a cross-sectional view depicting a semiconductor device including the carbon nanotube sheet of the first embodiment.

By this matter, as depicted in FIG. 15, similarly to FIG. 7 and FIG. 8 mentioned above, each carbon nanotube 20a is bent at its first constriction portion A and second constriction portion B to the lateral direction. As a result, the first carbon nanotube portion 21 in the lower end side of each carbon nanotube 20a is arranged to the lateral direction and contacts the back face of the semiconductor element 70.

Also similarly, the third carbon nanotube portion 23 in the upper end side of each carbon nanotube 20a is arranged to the lateral direction and contacts a bottom face of the concave portion C of the heat spreader 80.

The depth of the concave portion C of the heat spreader 80 is adjusted such that the plurality of carbon nanotubes 20a which are bent can be housed between the bottom face of the concave portion C of the heat spreader 80 and the back face of the semiconductor element 70.

By the above steps, a semiconductor device 3 of the embodiment is obtained.

Also, a heat sink may be further provided on the heat spreader 80 of the semiconductor device 3 in FIG. 15 through a thermal conduction material. The heat sink is formed from a flat plate portion and many heat radiation fins protruding on the flat plate portion. The carbon nanotube sheet 1 in FIG. 6 mentioned above may be used as the thermal conduction material.

Moreover, a heat pipe may be further provided on the heat spreader 80 of the semiconductor device 3 in FIG. 15 through the thermal conduction material. The heat pipe transports and radiates the heat by the phase change of the evaporation and the condensation in the operating fluid sealed in a hermetically-closed pipe.

In this case as well, the carbon nanotube sheet 1 in FIG. 6 mentioned above may be used as the thermal conduction material.

(Second Embodiment)

In the first embodiment mentioned above, by filling the resin portion 30 in the carbon nanotube aggregate 20, the carbon nanotube aggregate 20 is integrated like the sheet.

In a second embodiment, by covering the carbon nanotube aggregate with an alumina film, the carbon nanotube aggregate is integrated like the sheet.

Figure 16A:
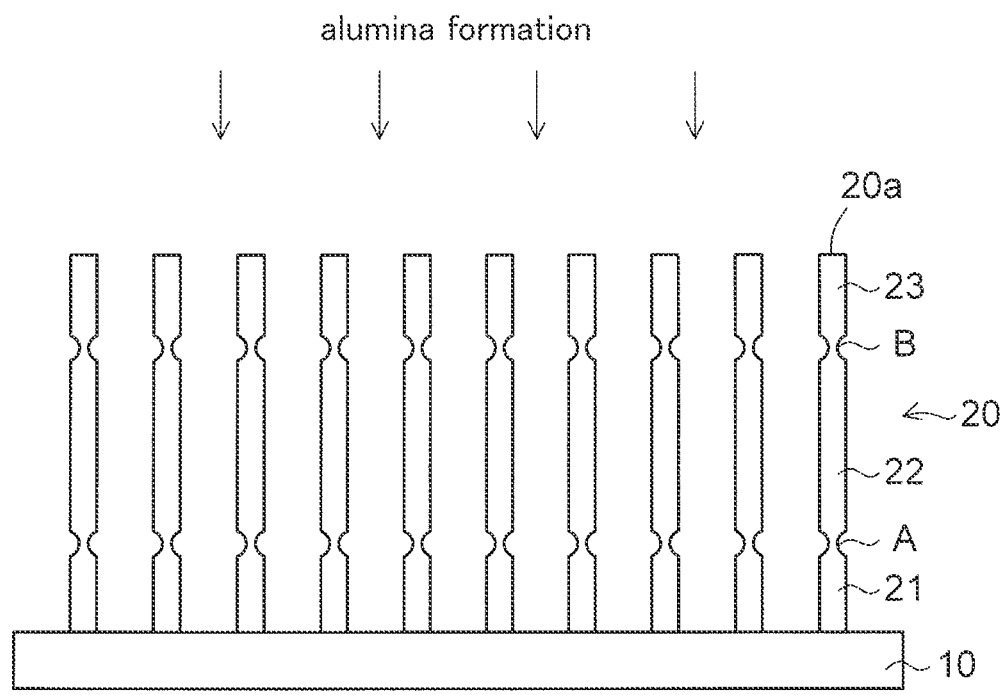
FIGS. 16A and 16B are cross-sectional views depicting a method of manufacturing a carbon nanotube sheet of a second embodiment (part 1).

In a method of manufacturing a carbon nanotube sheet of the second embodiment, as depicted in FIG. 16A, by performing the steps in FIG. 2A to FIG. 4A mentioned above, a carbon nanotube aggregate 20 similar to FIG. 4A is formed on the silicon substrate 10.

Figure 16B:
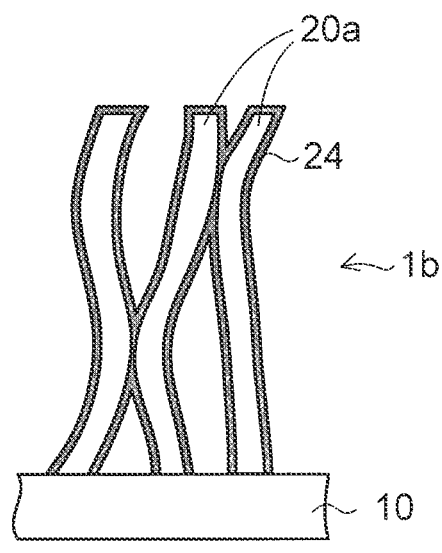

Thereafter, as depicted in FIGS. 16A and 16B, the surface of each carbon nanotube 20a is covered with an alumina film ($Al_2O_3$ film) 24 which is an ultra-thin film of an atomic layer level by ALD (Atomic Layer Deposition).

In FIG. 16A, the plurality of carbon nanotubes 20a are depicted to be separated each other. However, in the actual case, as depicted in the schematic view in FIG. 16B, the plurality of carbon nanotubes 20a are formed in a state that parts of the carbon nanotubes 20a contact so as to intertwine each other.

For this reason, by covering each of the carbon nanotubes 20a with the ultra-thin alumina film 24 and joining the carbon nanotubes 20a by the alumina film 24, a carbon nanotube sheet 1b which is integrated can be obtained. The following steps will be explained to use FIG. 16A.

Figure 17:
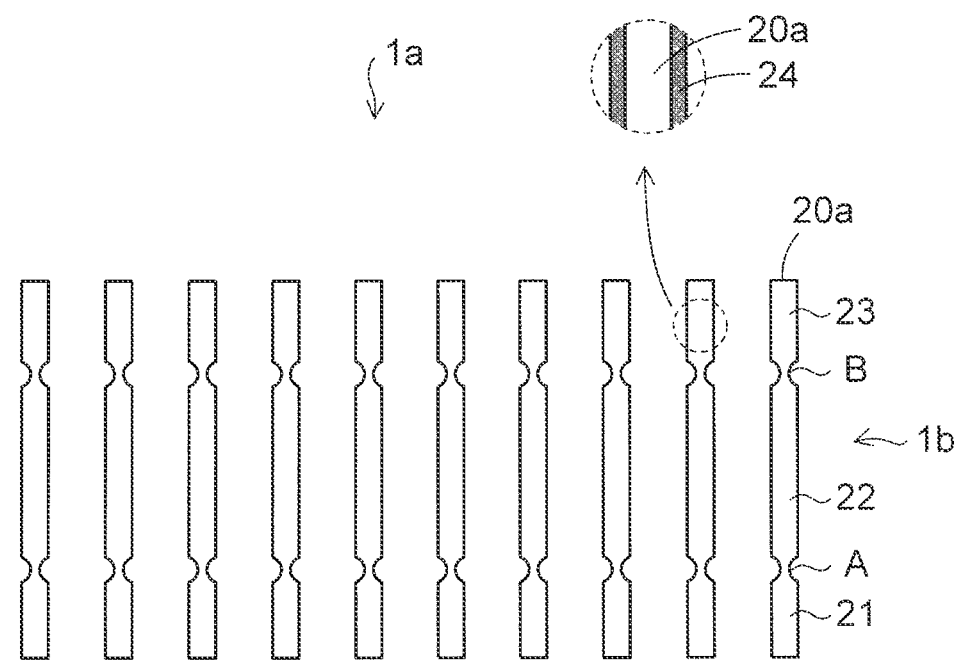
FIG. 17 is a cross-sectional view depicting the method of manufacturing a carbon nanotube sheet of the second embodiment (part 2).

Then, as depicted in FIG. 17, the carbon nanotube sheet 1b which is integrated by the alumina films 24 is detached from the silicon substrate 10. At this time, since the carbon nanotube sheet 1b is integrated by the alumina films 24, the carbon nanotube sheet 1b can be handled like the sheet without falling apart.

Figure 18A:
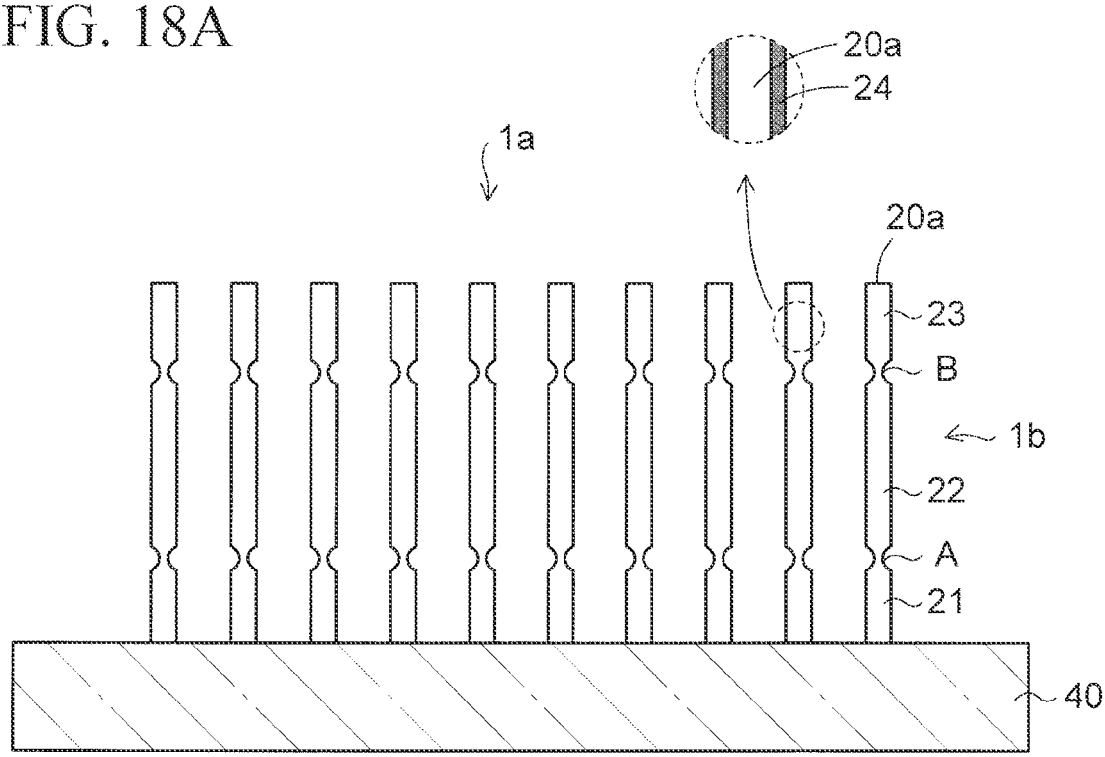
FIGS. 18A and 18B are cross-sectional views depicting a method of manufacturing an electronic device including the carbon nanotube sheet of the second embodiment (part 1).
Figure 18B:
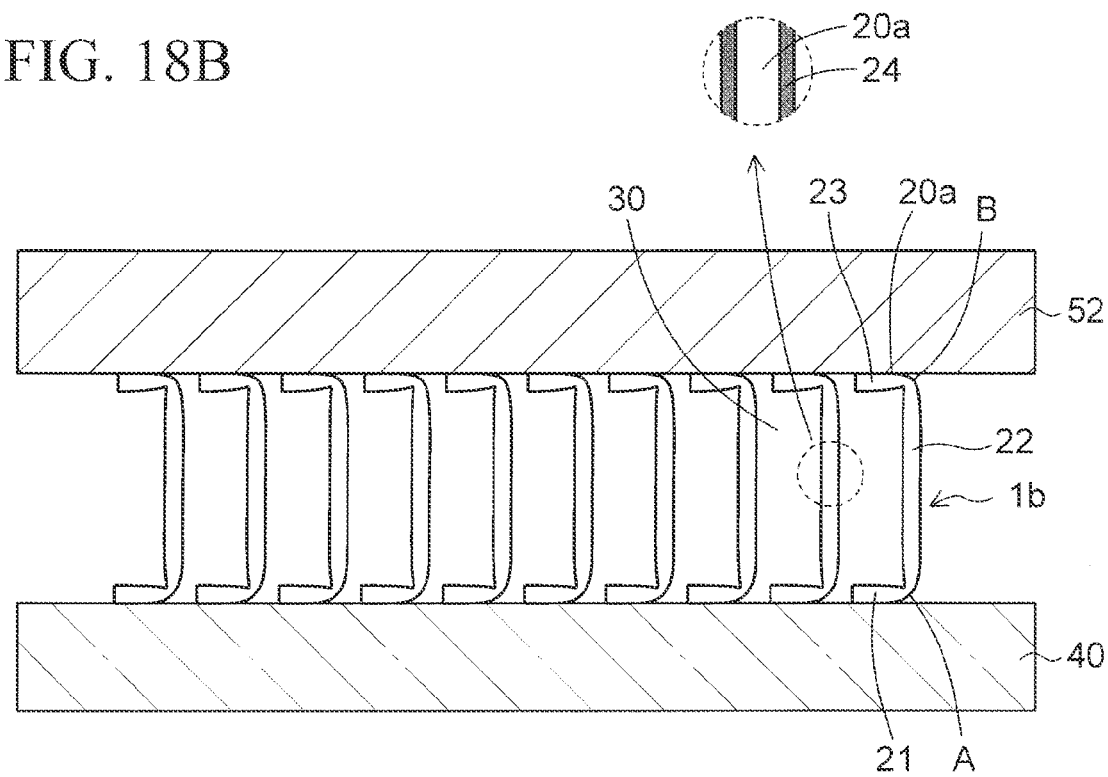

Subsequently, as depicted in FIG. 18A, the carbon nanotube sheet 1b in FIG. 17 is arranged on the heat generation body 40. Further, as depicted in FIG. 18B, the pressing member 52 is arranged on the carbon nanotube sheet 1b, and the pressing member 52 is pressed downward. At this point, since a resin portion is not yet filled in the carbon nanotube sheet 1b, it is not necessary to perform a heat process.

By this matter, similarly to FIG. 8 mentioned above, each carbon nanotube 20a is bent at the first constriction portion A and the second constriction portion B to the lateral direction. As a result, a first carbon nanotube portion 21 of which is bent at the first constriction portion A located in a lower end side of each carbon nanotube 20a is arranged to the lateral direction and contacts the heat generation body 40.

Also similarly, a third carbon nanotube portion 23 of which is bent at the second constriction portion B located in an upper end side of each carbon nanotube 20a is arranged to the lateral direction and contacts the pressing member 52.

In the second embodiment, since the resin portion is not yet filled when the carbon nanotube sheet 1b is bent, each carbon nanotube can be bent with a lower pressure than that in the first embodiment. Accordingly, in the case that the semiconductor element is used as the heat generation body 40, the damage to the semiconductor can be reduced as compared to the first embodiment.

Figure 19A:
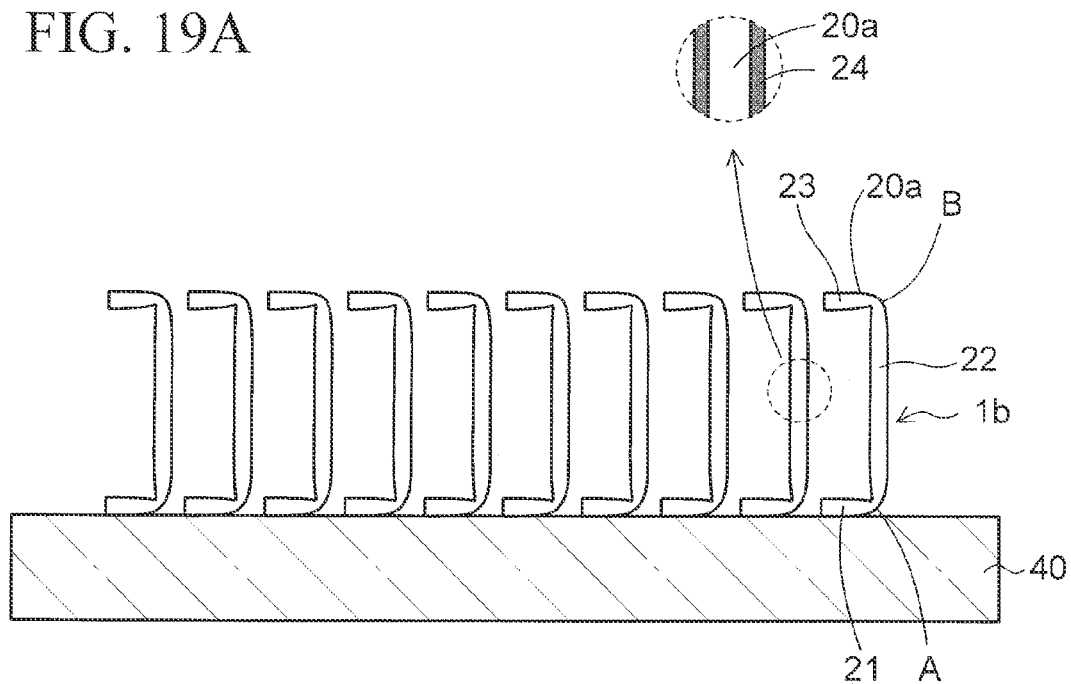
FIGS. 19A and 19B are cross-sectional views depicting the method of manufacturing an electronic device including the carbon nanotube sheet of the second embodiment (part 2).

Then, as depicted in FIG. 19A, the pressing member 52 is detached from the carbon nanotube sheet 1b. At this time, the third carbon nanotube portion 23 in the upper end side of each carbon nanotube 20a is maintained in the same state that the third carbon nanotube portion 23 is bent to the lateral direction.

Figure 19B:
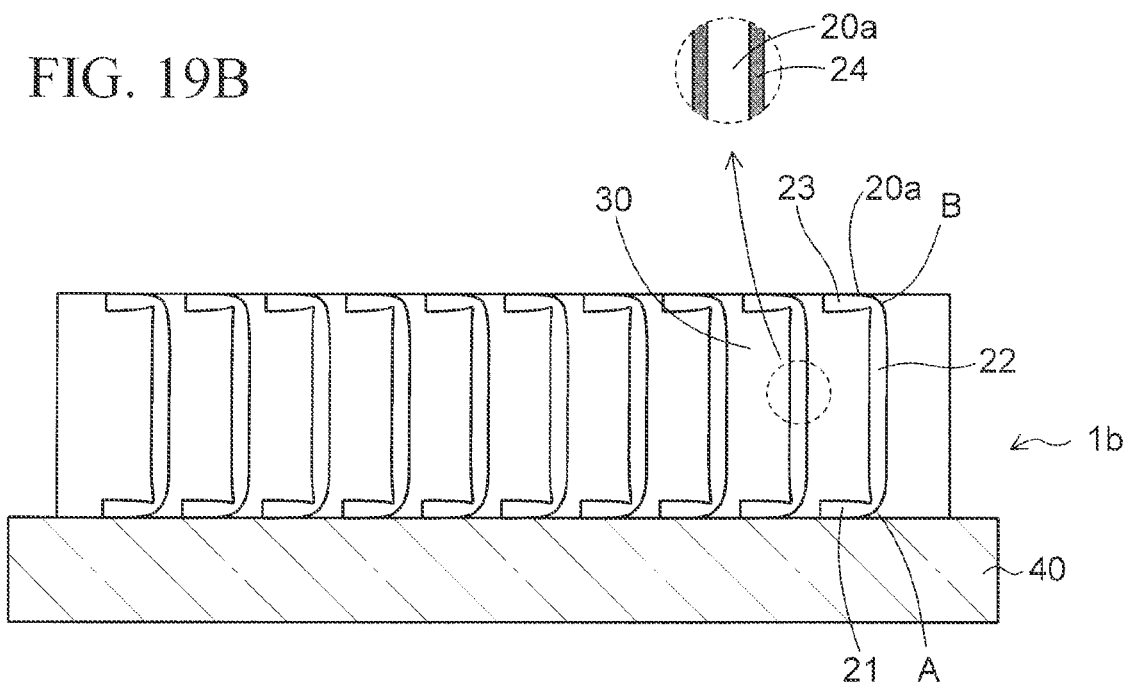

Then, as depicted in FIG. 19B, by the method similar to FIG. 4B and FIG. 5 mentioned above, a thermoplastic resin portion 30 is filled in the space in the carbon nanotube sheet 1b.

Figure 20:
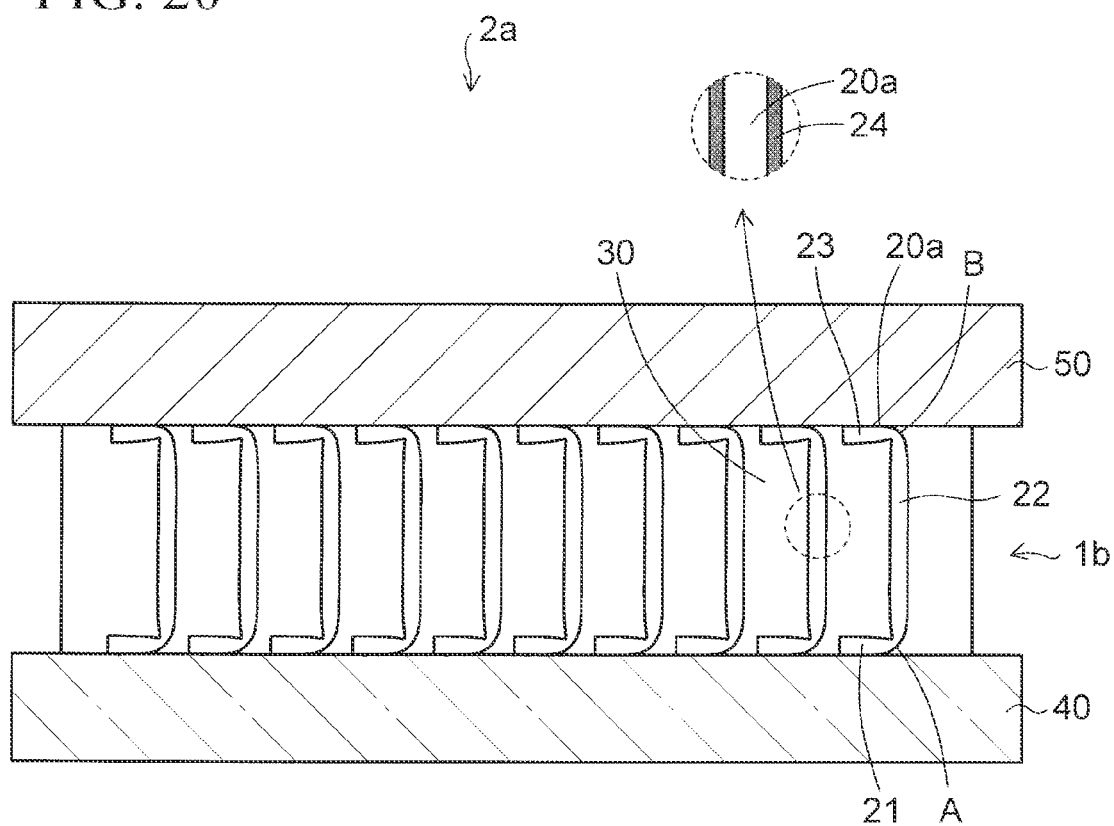
FIG. 20 is a cross-sectional view depicting an electronic device including the carbon nanotube sheet of the second embodiment.

Subsequently, as depicted in FIG. 20, a heat radiation member 50 is arranged on the carbon nanotube sheet 1b, while pressing the heat radiation member 50 downward, a heat process is performed at a temperature of about 250° C.

At this time, in the case that the resin portion 30 like a thin skin remains on an upper end face of each carbon nanotube 20a, the resin portion 30 is melted again and discharged to the outside. By this matter, the third carbon nanotube portion 23 which is bent and located in the upper end side of each carbon nanotube 20a contacts the heat radiation member 50.

Note that, in the step in FIG. 18B mentioned above, the carbon nanotube sheet 1b is pressed by the pressing member 52, but the carbon nanotube sheet 1b may be pressed by the heat radiation member 50. Thus, various kinds of members which can press can be used.

By the above steps, as depicted in FIG. 20, an electronic device 2a including the carbon nanotube sheet 1b of the second embodiment is manufactured. The electronic device 2a has substantially the same structure as the electronic device 2 of the first embodiment in FIG. 8 mentioned above and brings about similar advantageous effects.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a carbon nanotube sheet, comprising:
forming a plurality of carbon nanotubes on a substrate, each of the plurality of carbon nanotubes including a constriction portion at least in one end side;
filling a resin between the plurality of carbon nanotubes; and
removing the substrate.

(Clause 2) A method of manufacturing a carbon nanotube sheet, comprising:
forming a plurality of carbon nanotubes on a substrate, each of the plurality of carbon nanotubes including a constriction portion at least in one end side;
covering each of the plurality of carbon nanotubes with an alumina film; and
removing the substrate.

(Clause 3) A method of manufacturing an electronic device, comprising:
obtaining a carbon nanotube sheet by
forming a plurality of carbon nanotubes on a substrate, each of the plurality of carbon nanotubes including a constriction portion at least in one end side;
filling a resin between the plurality of carbon nanotubes; and
removing the substrate;
arranging the carbon nanotube sheet on a heat generation body; and
arranging a heat radiation member on the carbon nanotube sheet, and pressing the heat radiation member downward, thereby bending each of the plurality of carbon nanotubes at the constriction portion to a lateral direction.

(Clause 4) A method of manufacturing an electronic device, comprising:
obtaining a carbon nanotube sheet by
forming a plurality of carbon nanotubes on a substrate, each of the plurality of carbon nanotubes including a constriction portion at least in one end side;
covering each of the plurality of carbon nanotubes with an alumina film; and
removing the substrate;
arranging the carbon nanotube sheet on a heat generation body; and
arranging a member on the carbon nanotube sheet, and pressing the member downward, thereby bending each of the plurality of carbon nanotubes at the constriction portion to a lateral direction.

What is claimed is:

1. A carbon nanotube sheet, comprising:
a plurality of carbon nanotubes including a first constriction portion in one end side; and
a resin portion filled between the plurality of carbon nanotubes,
wherein the first constriction portion is arranged between a center part and one end part of the plurality of carbon nanotubes, and a diameter of the first constriction portion is smaller than each diameter of the center part and the one end part.

2. The carbon nanotube sheet according to claim 1, wherein each of the plurality of carbon nanotubes is bent at the first constriction portion to a lateral direction in one surface side of the resin portion.

3. The carbon nanotube sheet according to claim 1, wherein each of the plurality of carbon nanotubes includes a second constriction portion in the other end side,
wherein the second constriction portion is arranged between the center part and the other end part of the plurality of carbon nanotubes, and a diameter of the second constriction portion is smaller than each diameter of the center part and the other end part.

4. The carbon nanotube sheet according to claim 3, wherein each of the plurality of carbon nanotubes is bent at the first constriction portion to a lateral direction in one surface side of the resin portion, and is bent at the second constriction portion to the lateral direction in other surface side of the resin portion.

5. The carbon nanotube sheet according to claim 1, wherein each of the plurality of carbon nanotubes is covered with an alumina film.

6. An electronic device, comprising:
a carbon nanotube sheet including a plurality of carbon nanotubes including a first constriction portion in one end side, and a resin portion filled between the plurality of carbon nanotubes, wherein the first constriction portion is arranged between a center part and one end part of the plurality of carbon nanotubes, and a diameter of the first constriction portion is smaller than each diameter of the center part and the one end part,
wherein each of the plurality of carbon nanotubes is bent at the first constriction portion to a lateral direction in the resin portion;
a heat generation body arranged on one face of the carbon nanotube sheet, the heat generation body contacting a part which is bent at the first constriction portions located in the one end side of the plurality of carbon nanotubes; and
a heat radiation member arranged on the other face of the plurality of carbon nanotube sheet, the heat radiation member contacting the other end side of the plurality of carbon nanotubes.

7. The electronic device according to claim 6, wherein each of the plurality of carbon nanotubes includes a second constriction portion in the other end side, wherein the second constriction portion is arranged between the center part and the other end part of the plurality of carbon nanotubes, and a diameter of the second constriction portion is smaller than each diameter of the center part and the other end part,
each of the plurality of carbon nanotubes is bent at the second constriction portion to the lateral direction in the other surface side of the resin portion, and
the heat radiation member contacts a part which is bent at the second constriction portion located in the other end side of the plurality of carbon nanotubes.

* * * * *